United States Patent [19]

Peltz

[11] 3,795,044

[45] Mar. 5, 1974

[54] METHOD OF CONTACTING A SEMICONDUCTOR BODY HAVING A PLURALITY OF ELECTRODES UTILIZING SHEET METAL ELECTRIC LEADS

[75] Inventor: Hanns-Heinz Peltz, Munich, Germany

[73] Assignee: Siemens Aktiengesellschaft, Berlin, Germany

[22] Filed: July 22, 1971

[21] Appl. No.: 164,999

[30] Foreign Application Priority Data

July 29, 1970 Germany .......................... 2037666

[52] U.S. Cl. ......................... 29/591, 29/580, 156/11
[51] Int. Cl. ............................................ B01j 17/00
[58] Field of Search .................. 29/578, 591, 576 S

[56] References Cited

UNITED STATES PATENTS

| | | | |
|---|---|---|---|
| 3,390,308 | 6/1968 | Marley | 29/576 S |
| 3,436,810 | 4/1969 | Kauffman | 29/576 S |
| 3,559,285 | 2/1971 | Kauffman | 29/576 S |

*Primary Examiner*—Roy Lake
*Assistant Examiner*—W. C. Tupman
*Attorney, Agent, or Firm*—Herbert L. Lerner

[57] ABSTRACT

In a method of contacting a semiconductor body provided with several electrodes, utilizing a plurality of sheet metal electric leads, the thickness or width of the sheet metal is reduced at the ends of the tongue-like electric sheet metal leads with respect to the parts thereof bordering a common holder frame therefor. The ends of the leads are directly connected to the electrodes of the semiconductor body provided therefor.

3 Claims, 5 Drawing Figures

METHOD OF CONTACTING A SEMICONDUCTOR BODY HAVING A PLURALITY OF ELECTRODES UTILIZING SHEET METAL ELECTRIC LEADS

The invention relates to a method of contacting a semiconductor body having a plurality of electrodes utilizing sheet metal electric leads. More particularly, the invention relates to a method of contacting a semiconductor body having a plurality of electrodes with a plurality of electric leads of sheet metal which extend tongue-like or radially inward from a holder frame toward the center of the frame. The free ends of the electric leads are in conductive connection with the individual electrodes of the semiconductor body.

Known methods of this type customarily start with a flat metal band and produce therein a number of adjacent lead systems of the aforedescribed type, particularly by means of punching or etching. Each lead system has an outer holder frame from which the individual leads extend tongue-like within the plane of the band, into the interior of the frame. One of the tongue-like leads is widened at its inside end in the shape of a shovel and serves as a carrier for the semiconductor body. The semiconductor body is affixed to the shovel-shaped carrier by alloying or soldering.

The shovel-shaped lead has a central position within the holder frame. The other leads end short of the shovel-shaped crystal carrier. The ends of the other leads are conductively connected by fine wires to corresponding electrodes of the semiconductor body. The electrodes are preferably positioned on only one side of the semiconductor body. The entire device, including the ends of the tongue-like leads, as well as the shovel-shaped carrier lead, may be embedded in a block of synthetic material.

In another method, the ends of the tongue-like leads and the shovel-type carrier lead end in a lower housing portion of insulating material such as, for example, ceramic or glass. As a result, the leads are hermetically sealed and are led insulated through the side wall of the bottom of the housing. After the installation of the semiconductor device into the bottom of the housing, said housing is closed with a cover or lid of insulating material which is welded on.

An object of the invention is to provide a method of contacting a semiconductor body utilizing sheet metal electric leads which eliminates the need for wire conductors.

Another object of my invention is to provide a method of contacting a semiconductor body utilizing sheet metal electric leads which is simple in execution and which is efficient, effective and reliable.

Still another object of the invention is to provide apparatus of simple structure for contacting a semiconductor body with sheet metal electric leads, which apparatus is sturdy, compact and reliable.

It is desirable to connect the tongue-like leads of the aforedescribed apparatus directly to the electrodes of the semiconductor device, body or system which is to be contacted. The aforedescribed intermediate connecting members, such as the contacting wire or carrier plate for the semiconductor provided with conductor paths, would no longer be required.

In accordance with the method of the invention, the thickness or width of the material at the ends of the tongue-like leads is reduced or tapered in comparison to the thickness or width of the parts adjacent the holder frame. The ends of the leads are directly connected to corresponding or coordinated electrodes of the semiconductor body. The tongue-like leads which contact the electrodes are preferably the only carrier elements which are directly connected to the semiconductor body. Subsequently, the contacted semiconductor device and the lead system or apparatus are embedded in insulating material, with the exception of the outer portions of the leads or connections and the holder frame.

There are preferable variants of the method of the invention. The variants of the invention are described as follows:

VARIANT I

The most important fact concerning the first embodiment is that the metal sheet to be formed into the system of leads, or processed, is provided on one side with a complete photo-varnish mask which covers only the sheet portions which subsequently form or define the holder frame to be produced and all the tongue-like leads. The other side of the metal sheet is provided with an incomplete photo-varnish mask which covers only the sheet portions to be converted or formed into the holder frame and the parts of the tongue-like leads adjacent the holder frame. Then, with the assistance of the two photo-varnish masks, marked depressions are etched into the metal sheet. The side of the sheet which had been covered with the complete photo-varnish mask is then completely covered with photo-varnish. The etching process is finally continued until the sheet portions which correspond to the tongue-like leads are clearly separated from each other at their tapered free ends, as well as along their lengths.

VARIANT II

In the second embodiment, the metal sheet to be processed to form the system of leads is provided on one side with a complete photo-varnish mask which covers only the sheet portions to be subsequently used for the holder frame and all the tongue-type leads. The other side is provided with an incomplete photovarnish mask which covers only the sheet portions which correspond to the parts of the tongue-like leads adjacent the holder frame and having a normal sheet thickness. With the assistance of both photo-varnish masks, marked depressions are etched into the metal sheet. The incomplete photo-varnish mask is then so supplemented that it corresponds to the complete mask, also at the free ends of the tongue-like leads, and coincides with said mask. The etching process is continued with the assistance of the then-completed two photo-varnish masks serving as an etching mask. The etching process is continued until the sheet portions which correspond to the tongue-like leads are clearly separated along their entire lengths.

VARIANT III

In the third embodiment, a pan-like depression is first produced by stamping and/or etching the sheet metal which is being processed into the system of leads. The tongue-like leads and the holder frame which connects them are so fashioned by punching and/or etching that the free ends of all said leads are formed from the bottom of the pan-like depressions.

The following should be observed in all the aforedescribed embodiments of the invention:

a. In all cases, the mutual distances of the free ends of the tongue-like leads should be selected so that they correspond exactly to the mutual distances of the electrodes of the semiconductor body to be contacted.

b. The ends of the tongue-like leads having reduced widths or thicknesses form a pan-like depression in the portion of the tongue-like leads having normal sheet widths or thicknesses. The depression has a planar bottom which is perforated, however, due to the structure of the tongue-like leads. The semiconductor body, system, or the like, and its electrodes are mounted on and alloyed or soldered to the semiconductor body, system, or the like, to be contacted. In most cases, none of the leads are at the center of the bottom of the pan-like depression. The middle part of the semiconductor body is positioned above or below the center of the lead system. The center of the lead system is devoid of leads. The semiconductor body is preferably plate-shaped. The electrodes or connecting points of the semiconductor body, crystal or system are situated approximately at the egde of the semiconductor crystal. The electrodes are so positioned that their positions relative to each other correspond to the mutual distances between the free ends of the tongue-like leads. Thus, the free ends of the leads may easily be placed in positions required for contacting, relative to the electrodes of the semiconductor crystal, and are permanently connected thereto by soldering or alloying. Ultrasonic soldering may be utilized to provide the permanent connection.

c. The tongue-like leads extend radially from their free ends to be connected to the electrodes until they reach the holder frame. In longitudinal section, the leads comprise a thinner part, corresponding to the pan-shaped depression, and a thicker part, positioned further away radially, whose original thickness and that of the holder frame are the same as the thickness of the metal sheet used to produce the structure.

d. The individual, tongue-like leads may be reinforced, apart from their thinned ends, with respect to their mechanical stability, by means of cross-bracings. The cross-bracings and the holder frame are removed after the mounting of the semiconductor system is completed, particularly after the installation into a housing or synthetic wrapping.

e. The lateral dimensions, particularly the widths, of the free ends of the tongue-like leads must be individually adjusted to the geometry of the electrodes to be contacted. The reduction of the maximum thickness to be effected is also adjusted to the dimensions of the semiconductor device to be contacted. That is, the thickness of the sheet at the tapered free ends of the tongue-like leads should not exceed the lateral dimensions of the electrodes to be contacted.

The most precise structures may thus be obtained only if the maximum thickness corresponds to the masses of the structure. If, for example, a tongue-like lead having a width of 50 micrometers is to be produced, it is preferable, with regard to economy and also for a precise execution of details, that the thickness of the material from which the structure is produced have a maximum which is the same, meaning 50 micrometers. On the other hand, for mechanical and technical reasons much greater thicknesses and widths of the material are preferred beyond the free ends of the tongue-like leads to be connected to the electrodes and for the holder frame of the leads. These thicknesses and widths are much greater than is permissible for electrodes to be contacted by the electrodes of the semiconductor body.

For the indicated reasons, a reduction in the thickness and width of the sheet of the tongue-like leads is provided at the free ends of said leads. This structure may be obtained, for example, in two ways. The first way involves etching at variable speeds, due to variable spray pressure and with the same etching agent. The etching process may be interrupted after the eching depth of the most precise structure has been attained. After this, the side of the precision structure is covered and the etching of the rough structure is completed (first embodiment). The second way involves the pre-stamping of the precisely structured part and precision punching following rough punching (third embodiment).

It becomes understandable why, primarily in the first and second embodiments of the method of the invention, relating to the production of the structure of the tongue-like leads and the holder frame, the underetching of the photo-varnish mask, which is effected of necessity, may be considered. The dimensions of the photo-varnish mask should be selected to be somewhat larger than the dimensions of the desired structure.

The first, second and third embodiments of the method of the invention are supplemented according to the invention to the extent that the semiconductor body to be contacted and its electrodes are placed in contact with the free ends of the tongue-like leads and are permanently affixed thereto. The dimensions of the tongue-like leads are adjusted to the conditions of the electrodes of the semiconductor body.

In order that the invention may be readily carried into effect, it will now be described with reference to the accompanying drawing, wherein.

In the figures, the same components are identified by the same reference numerals.

Figure 1:
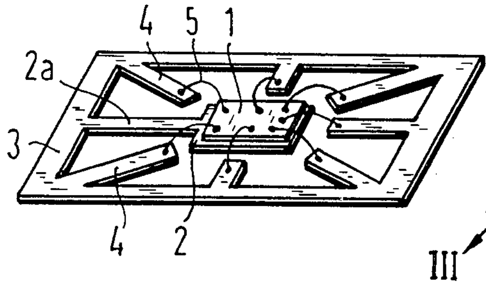
Fig.1 PRIOR ART
FIG. 1 is a perspective view of known contacting apparatus, and illustrates a known contacting method.

FIG. 1 illustrates a known contacting method. A semiconductor body or system 1 which may comprise, for example, an integrated circuit having connecting electrodes, is affixed to a shovel-shaped or shovel-type carrier lead 2 of sheet metal. The shovel-type carrier 2 has a stem, post, or the like, 2*a* connected to a holder frame 3 of sheet metal which surrounds said carrier lead on all sides and is coplanarly positioned therewith.

A plurality of tongue-like leads 4, of a specific number, extend radially from other parts of the holder frame 3 toward the carrier lead 2. For onvious reasons, the tongue-like leads 4 are clearly separated from the carrier lead 2 of the semiconductor system. A single appropriately thin contact wire 5 contacts each electrode of the semiconductor system 1 at one end and contacts the free end of the corresponding tongue-like lead 4 at the other end.

The holder frame 3, the carrier lead 2 and the tongue-like leads 4 have adequate material strength to tolerate the mechanical stresses which occur during machining and contacting. The contacting wires 5 are very thin, however.

Another, similar solution may be provided in accordance with German Pat. application No. P 20 23 680.0 (VPA 70/1103). In the disclosure of the German Patent Application, the metal carrier lead 2 provided in the device of FIG. 1 is replaced by a carrier lead comprising insulating material having a surface provided with electrical conductor paths. The conductor paths are nonintersecting and end at the periphery of the insulating carrier. Each conductor path is soldered to the end of a corresponding one of the tongue-like electrical leads within the holder frame. The tongue-like leads thus support the carrier of the semiconductor system, which therefore need not be directly connected to the holder frame 3. The carrier of the semiconductor system is preferably an insulating plate.

The semiconductor system is mounted with its electrode side on the insulating carrier in such a manner that one electrode is positioned at a corresponding end of each of the conductor paths. In this manner, one of the tongue-type leads contacts each electrode of the semiconductor system to be contacted. Preferably, the conductor paths are so positioned on the insulating carrier that they extend radially inwardly from the periphery of the carrier and end short of meeting each other. At their corresponding ends, the conductor paths are bridged by the mounted semiconductor system, and at their other ends said conductor paths are connected to corresponding ones of the tongue-like leads extending from the holder frame.

Figure 2:
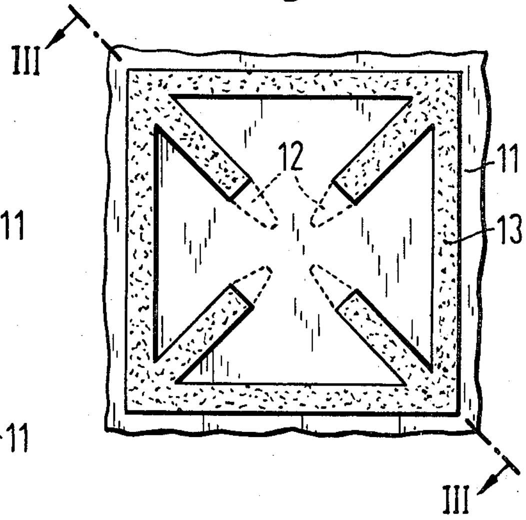
FIGS. 2, 3 and 4 are schematic diagrams of parts of the contacting apparatus of the invention, and illustrate the first and second embodiments of the method of the invention.
Figure 3:
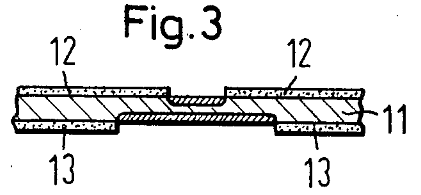
Figure 4:
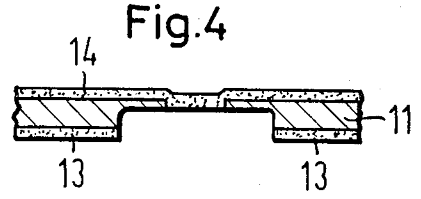

In FIGS. 2, 3 and 4, an original sheet of metal 11 used in the production of the lead system of the invention comprises, for example, Vacon or brass. The sheet of metal has a thickness of 300 micrometers, for example. One side of the sheet 11 is coated with a photo-varnish mask 12 (FIGS. 2 and 3) which corresponds exactly to the structure of the lead system to be produced. Included with the part which corresponds to the holder frame, the photo-varnish mask 12 substantially resembles the structure of a wheel with a missing hub.

An incomplete photo-varnish mask 13 is coated on the opposite side of the sheet 11. The "wheel spokes" of the incomplete photo-varnish mask 13, which correspond to the tongue-like leads, are shorter in length than in the complete photovarnish mask 12. All the other parts of the incomplete photovarnish mask 13 correspond exactly to the complete photo-varnish mask 12 and said masks coincide exactly with each other on the sheet 11.

The positioning of both photo-varnish masks 12 and 13 relative to each other is shown in FIGS. 2, 3 and 4. FIG. 2 represents the cut-out of a plan view which is taken from the side of the incomplete photo-varnish mask 13. FIG. 3 shows the profile of an intermediate section, taken along the lines III—III of FIG. 2. FIG. 4 shows the profile of the same intermediate section as FIG. 3, after the completion of the etching process and immediately prior to the removal of the photo-varnish masks 12 and 13 which were utilized during the second etching process.

The ends of the "wheel spokes" of the complete photovarnish mask 12, which are not visible in FIG. 2, and which do not coincide with the incomplete photo-varnish mask 13, are shown by dots. The device shown in FIGS. 2 and 3 is then subjected to a first etching process. The duration of the first etching process is determined from different viewpoints, in accordance with the first and second embodiments of the invention.

In the second embodiment of the method of the invention, the thickness of the tongue-like leads is determined at their ends which are to contact the semiconductor system, by the difference of the original thickness of the sheet 11 and the total etching depth obtained during the first etching process. In the first embodiment of the method of the invention, however, the difference between the etching depths attained during both etching processes determines the thickness of the material at the tapered ends of the tongue-like leads.

During the first etching process, an etching depth is reached which is shown densely cross-hatched in FIG. 3. After the completion of the first etching process, the device is completely coated with photo-varnish 14 (FIG. 4) on the side which is provided with the complete photo-varnish mask 12, in accordance with the first embodiment of the method of the invention. At the same time, the incomplete mask 13 is maintained unchanged. This condition is illustrated in FIG. 4, which also illustrates an intermediate section taken along the lines III—III of FIG. 2. In the second embodiment of the method of the invention, the complete photo-varnish mask 12 remains unchanged, while the incomplete photo-varnish mask 13 is so supplemented that it corresponds exactly to said complete photo-varnish mask.

The second etching process is carried out with both devices for just as long a period of time as it takes for the material of the metal sheet 11 to disappear in the areas which were not covered during either of the two etching processes. This produces a holder frame structure in which the ends of the tongue-like leads extending therefrom have the desired reduction of material thickness and width.

Figure 5:
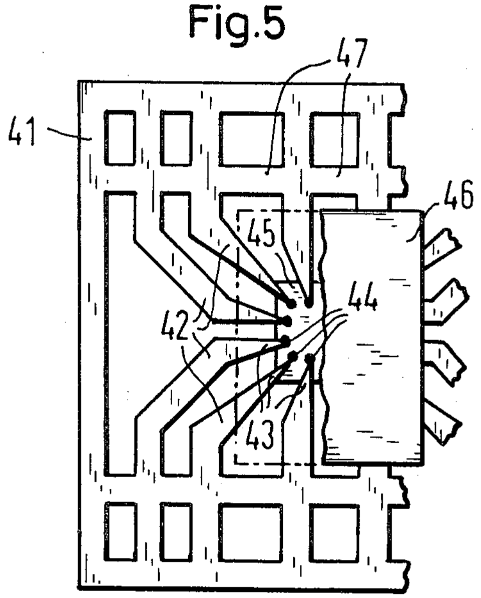
FIG. 5 is a schematic diagram of the contacting apparatus of the invention, and illustrates the positioning of the leads and the semiconductor body in accordance with the method of the invention.

The produced device is then further contacted in the manner shown in FIG. 5. The device comprises a holder frame 41 from which a plurality of tongue-like leads 42 extend inward, toward each other. The geometrical configuration of the leads is somewhat different than in the lead system of FIG. 1, but this is of no importance to the invention. The inwardly directed ends 43 of the leads 42 have a markedly lower sheet thickness and width than the remaining parts of the lead system, in accordance with the present invention, and due to the disclosed processing method.

The semiconductor crystal device 45 is then positioned on the ends 43 of the tongue-like leads 42 in such a manner that the end of each of said leads contacts exactly one corresponding electrode 44 of said semiconductor device. The electrodes 44 are connected to the ends 43, in this position. The device thus produced is embedded in a block 46 of synthetic or plastic material. Thereafter, the frame and other cross-connection 47, which may occur between the leads, are removed. The portions of the tongue-like leads 42 which project beyond the synthetic material 46 are then used during the further installation of the device into electrical apparatus.

The block 46 of synthetic material has been illustrated only in part in FIG. 5 in order to show the coordination of the leads 42, through their ends 43, and the electrodes 44 of the semiconductor device 45.

While the invention has been described by means of specific examples and in specific embodiments, I do not wish to be limited thereto, for obvious modifications will occur to those skilled in the art without departing from the spirit and scope of the invention.

I claim:

1. A method of contacting a semiconductor body which is provided with several electrodes, utilizing a system of electric leads made of a metal sheet, the leads extending tongue-like from a holder frame into the interior of the frame and having the tongue ends for conductive connection with individual electrodes, said method comprising the steps of applying a complete mask of photo-varnish to one side of a metal sheet to be converted to the system of leads which mask covers only the sheet metal portions which are subsequently to constitute the holder frame and all of the tongue-like leads; applying an incomplete photo-varnish mask to the other side of the metal sheet which mask covers only the sheet metal portions corresponding to the holder frame and the parts of the tongue-like leads adjacent to the holder frame; etching depressions into the metal sheet using the photo-varnish masks as etching masks; replacing the complete photo-varnish mask by a photo-varnish layer which fully covers the side of the metal sheet that had been previously covered by the complete photo-varnish mask continuing the etching process until the sheet portions corresponding to the tongue-like leads are just discernibly separated from each other at the ends of reduced thickness and along their remaining lengths up to the holder frame; placing the semiconductor body and its electrodes into contact with the ends of the tongue-like leads; and permanently joining the ends of the tongue-like leads and the electrodes.

2. A method as claimed in claim 1, comprising the step of etching the metal sheet to produce the tongue-like leads and the holder frame connecting the leads.

3. A method as claimed in claim 1, comprising the step of embedding the semiconductor body and the ends of the tongue-like leads and at least part of the thicker portion of the tongue-like leads in a block of plastic material after the semiconductor body is mounted, and thereafter removing the holder frame to insulate the individual tongue-like leads from each other.

* * * * *